United States Patent
Ooi et al.

(10) Patent No.: US 9,823,303 B1
(45) Date of Patent: Nov. 21, 2017

(54) METHODS FOR SELECTING INTEGRATED CIRCUIT DIES BASED ON PRE-DETERMINED CRITERIA

(71) Applicant: Altera Corporation, San Jose, CA (US)

(72) Inventors: Teng Chow Ooi, Bayan Lepas (MY); Azni Abd Rahman, Subang Jaya (MY); Wei Hoong Yap, Gelugor (MY); Chee Ang Ling, Ayer Tawar (MY); Yew Mun Chan, Ipoh (MY)

(73) Assignee: Altera Corporation, San Jose, CA (US)

( * ) Notice: Subject to any disclaimer, the term of this patent is extended or adjusted under 35 U.S.C. 154(b) by 796 days.

(21) Appl. No.: 14/213,462

(22) Filed: Mar. 14, 2014

(51) Int. Cl.
  *H01L 21/00* (2006.01)
  *G01R 31/317* (2006.01)
  *G01R 31/28* (2006.01)
  *H01L 21/66* (2006.01)

(52) U.S. Cl.
  CPC ... *G01R 31/31718* (2013.01); *G01R 31/2894* (2013.01); *H01L 22/20* (2013.01); *H01L 2924/00* (2013.01)

(58) Field of Classification Search
  CPC .......... G01R 31/2894; G01R 31/31718; H01L 22/20; H01L 2924/00
  See application file for complete search history.

(56) References Cited

U.S. PATENT DOCUMENTS

| | | | |
|---|---|---|---|
| 7,539,893 B1 | 5/2009 | Ferguson | |
| 7,580,924 B1* | 8/2009 | Ling | G06Q 10/10 |
| 8,155,907 B1* | 4/2012 | Lesea | G06F 11/26 |
| | | | 702/108 |
| 8,315,730 B2 | 11/2012 | Jones et al. | |
| 8,539,429 B1 | 9/2013 | Bickford et al. | |
| 8,560,980 B2 | 10/2013 | Xiong et al. | |
| 8,872,536 B1* | 10/2014 | Trimberger | G01R 31/2894 |
| | | | 324/757.03 |
| 9,322,874 B2* | 4/2016 | Arnold | G01R 31/2889 |
| 2008/0189575 A1* | 8/2008 | Miguelanez | G05B 23/0229 |
| | | | 714/25 |
| 2011/0178967 A1* | 7/2011 | Delp | G05B 23/0229 |
| | | | 706/20 |
| 2013/0124133 A1 | 5/2013 | Anemikos et al. | |

* cited by examiner

*Primary Examiner* — John Breene
*Assistant Examiner* — Mohammad Islam
(74) *Attorney, Agent, or Firm* — Treyz Law Group, P.C.; Vineet Dixit

(57) ABSTRACT

Methods for selecting integrated circuit dies based on pre-determined criteria are disclosed. A disclosed method includes binning tools that characterizes multiple integrated circuit dies based on performance attributes. Each integrated circuit die is labeled with an identifier that represents bin location of the integrated circuit die within a die storage structure. A user can search for integrated circuit dies that matches certain performance grading by providing a performance description to an input interface on testing equipment. A tester is then configured to perform a screening to identify the physical locations of integrated circuit dies that match the retrieved identifiers from the die storage structure.

20 Claims, 7 Drawing Sheets

METHODS FOR SELECTING INTEGRATED CIRCUIT DIES BASED ON PRE-DETERMINED CRITERIA

BACKGROUND

The increased complexity in integrated circuit (IC) devices has driven logic designers to use a variety of automation tools to test the devices. Integrated circuit devices are tested and graded based on speed (e.g., binning) or any other performance specification. Generally, physical hard bins are designated to manage IC device inventories. As an example, each physical hard bin may represent a list of performance specifications. As such, IC devices with features that match the list of performance specifications are grouped together and physically sorted into their respective bins.

However, the binning process is complicated by manufacturing variations that are difficult or impossible to avoid as IC devices become smaller and more complex. Manufacturing variations may cause one or more parameters to vary between ICs that are formed according to the same IC design. While it is possible to provide additional bins to group the IC devices, to do so becomes impractical and expensive due to the increasing number of features and parameter variations in different IC devices.

In cases where there is a need to cater for customers with specific performance criteria, selecting the right IC devices based on customer requirements is time-consuming. For example, each bin may need to undergo rescreening in order to retrieve a specific IC device with performance features that satisfy a particular customer's requirements.

SUMMARY

In accordance with the present invention, apparatuses and methods are provided for selecting integrated circuit dies based on pre-determined criteria.

It is appreciated that the present invention can be implemented in numerous ways, such as a process, an apparatus, a system, or a device. Several inventive embodiments of the present invention are described below.

A method for automated die selection is disclosed. The method includes characterizing integrated circuit dies based on a set of performance attributes using binning tools. Using computer equipment, at least one requested performance feature is received. The method further includes selecting at least one integrated circuit die with performance attributes that satisfy the requested performance feature.

A method for using computer equipment having a tester and storage is provided. The method includes storing identifiers where each identifier is associated with a respective integrated circuit die. Each identifier of the group of identifiers is stored with a corresponding set of performance attributes. Performance criteria description is received from a user for die selection. The performance criteria description is received at an input interface of the computer equipment. The method further includes selecting a list of identifiers from the storage based on the performance criteria description. A test program is then created using the computer equipment, where the test program includes information that identifies integrated circuit dies based on the list of identifiers.

Another method of selecting an integrated circuit die using test equipment is disclosed. The method includes receiving a requested die performance criteria at an input interface of the test equipment. Based on the die performance criteria, location coordinates of the integrated circuit die is retrieved from a database.

Further features of the invention, its nature and various advantages, will be more apparent from the accompanying drawings and the following detailed description of the preferred embodiments.

DETAILED DESCRIPTION

The embodiments provided herein include methods for selecting integrated circuit dies based on pre-determined criteria.

It will be obvious, however, to one skilled in the art, that the present exemplary embodiments may be practiced without some or all of these specific details. In other instances, well-known operations have not been described in detail in order not to obscure unnecessarily the present embodiments.

Figure 1:
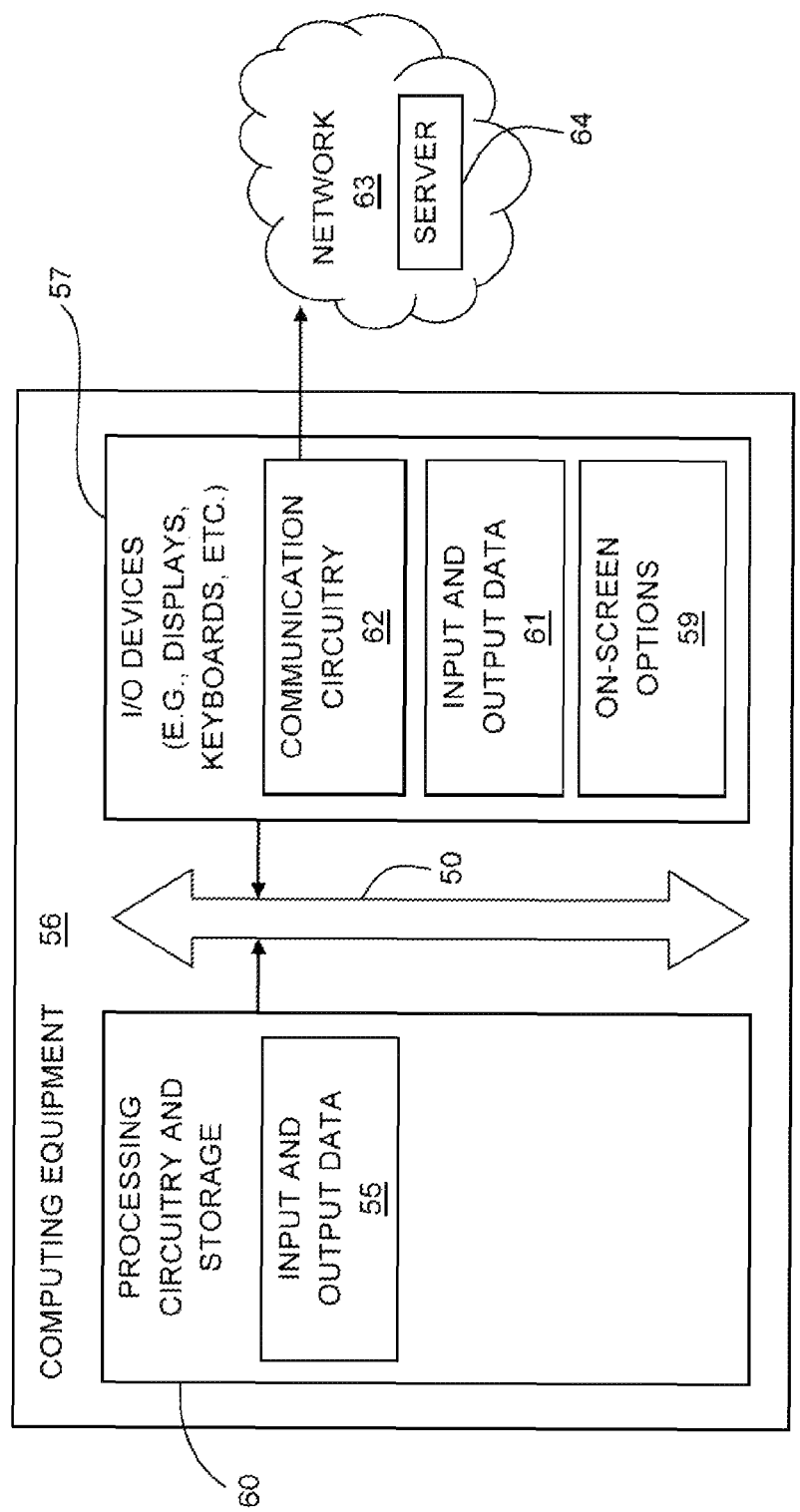
FIG. 1 is a block diagram of illustrative computing equipment that may be used to implement computer-based software tools in accordance with an embodiment of the present invention.

FIG. 1 is a block diagram of illustrative computing equipment 56 in accordance with an embodiment of the present invention. Computing equipment 56 may include processing circuitry and storage 60. Computing equipment 56 may be based on one or more processors such as personal computers, workstations, etc. Processing circuitry and storage 60 may include circuitry for performing various supported instructions. Storage in circuitry 60 may be organized to form shared and stand-alone databases. The stored information in the storage of processing circuitry 60 may include input and output data 55. For example, input data may include settings selected by a user or a software library. Output data may include modeling results, configuration data, reports and any other suitable processed output from computing equipment 56.

In supporting design operations involved in implementing a desired custom logic function, computing equipment 56 may use software that runs on storage and processing circuitry 60. This software may take the form of one or more programs. When the programs are running on computing equipment 56, computing equipment 56 is sometimes referred to as a computer-aided design tool (or tools).

Input and output devices 57 may include input devices such as pointing devices and keyboards and may include output devices such as printers and displays. As shown in FIG. 1, computing equipment 56 may display on-screen options 59 on a display. The user may click on these on-screen options or may otherwise make selections based on the displayed information. The user may also provide input by typing into text boxes, by performing drag and drop operations, using tabs, etc. Input and output data 61 may include input data (e.g., data that a user has typed into a text-box or has selected using a drop-down menu or other selectable options) and output data (e.g., modeling results, reports, information indicative of design choices, etc.). Input and output data 61 may be displayed on a display or printed for a user.

Communication circuitry 62 may facilitate data and information exchange between various circuits of computing equipment 56 through bus interface circuitry 50. As an example, communication circuitry 62 may provide various protocol functionality (e.g., Transmission Control Protocol/Internet Protocol (TCP/IP) (including the physical layer, or PHY), User Datagram Protocol (UDP) etc.), as desired. As another example, communication circuitry 62 may communicate with network 63 (e.g., Ethernet, token ring, etc.). Network 63 may include one or more servers 64 that store data and information. During integrated circuit testing, communication circuitry 62 may be configured to store performance results of each tested integrated circuit on server 64. If desired, communication circuitry 62 may be used to send and receive data such as the performance results from server 64 over network 63.

Figure 2:
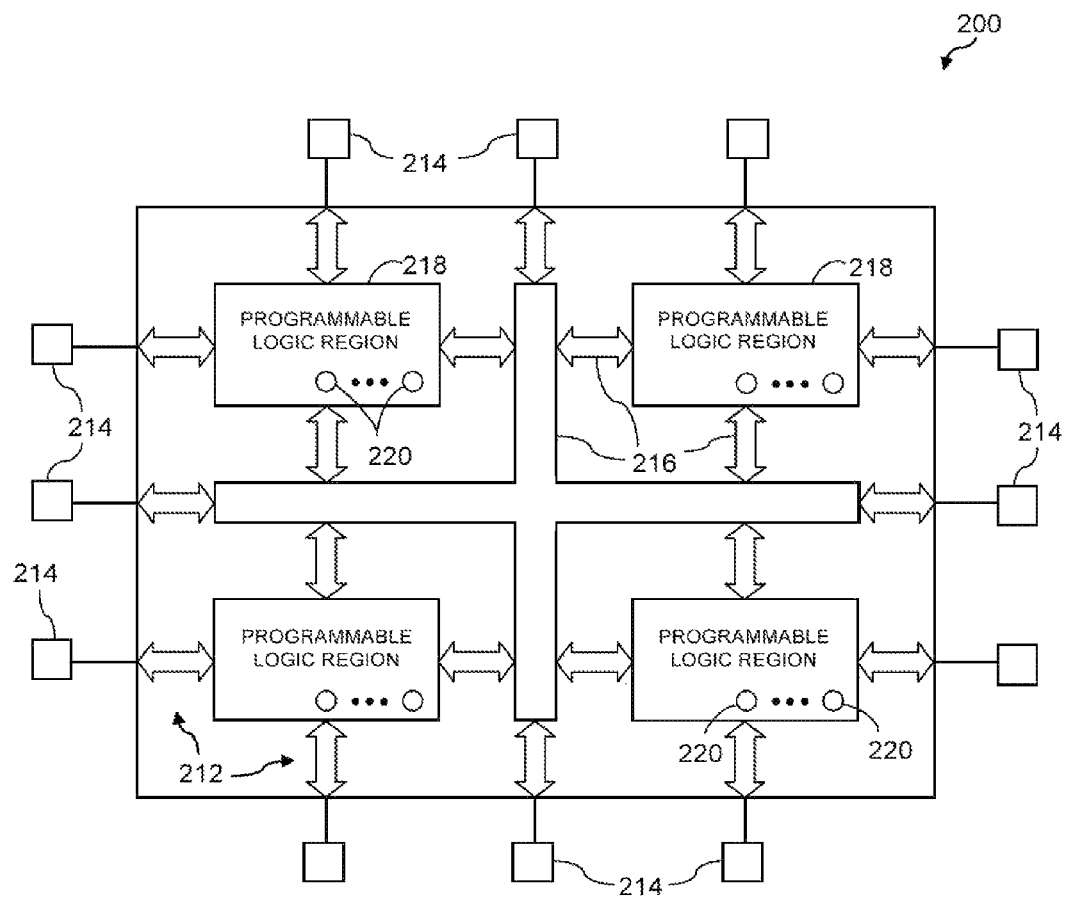
FIG. 2 is a diagram of an illustrative integrated circuit in accordance with an embodiment of the present invention.

FIG. 2 is a diagram of an illustrative integrated circuit 200 in accordance with an embodiment of the present invention. Integrated circuit 200 may have input/output circuitry 212 for driving signals off of integrated circuit 200 and for receiving signals from other circuits or devices via input/output pins 214. Interconnection resources 216 such as global and local vertical and horizontal conductive lines and busses may be used to route signals on integrated circuit 200. Interconnection resources 216 may include fixed interconnects (conductive lines) and programmable interconnects (e.g., programmable connections between respective fixed interconnects). Programmable logic 218 may include combinational and sequential logic circuitry. The programmable logic 218 may be configured using computing equipment such as computing equipment 56 of FIG. 1 to perform a custom logic function. The programmable interconnects associated with interconnection resources 216 may be considered to be a part of programmable logic 218.

A typical memory element 220 is formed from a number of transistors configured to form cross-coupled inverters. For example, complementary metal-oxide-semiconductor (CMOS) integrated circuit technology may be used to form memory elements 220 with one suitable approach. In the context of programmable logic device integrated circuits, memory elements 220 may store configuration data and are therefore sometimes referred to as configuration random-access memory (CRAM) cells.

Memory elements 220 are generally arranged in an array pattern. In a programmable logic device, there may be millions of memory elements 220 on each chip. A user (e.g., a logic designer) may provide configuration data for the array of memory elements during programming operation. Once loaded with configuration data, memory elements 220 may selectively control (e.g., turn on and off) portions of the circuitry in programmable logic region 218 and thereby customize its functions as desired.

When memory elements 220 are arranged in an array, horizontal and vertical conductors and associated control circuitry may be used to access the memory elements 220. The control circuitry may, for example, be used to clear all or some of the memory elements. The control circuitry may also write data to the memory elements 220 and may read data from the memory elements 220. For example, in CRAM arrays, memory elements 220 may be loaded with configuration data. The loaded configuration data may then be read out from the memory array to confirm proper data capture before device 10 is used during normal operation in a system.

The circuitry of programmable logic device 200 may be organized using any suitable architecture. For instance, programmable logic regions 18 may be organized in a series of rows and columns of larger programmable logic regions each of which contains multiple smaller regions. The larger regions are sometimes referred to as logic array blocks. The smaller logic regions are sometimes referred to as logic elements. A typical logic element may contain a look-up table, registers, and programmable multiplexers. If desired, programmable logic regions 18 may be arranged in more levels or layers in which multiple large regions are interconnected to form still larger portions of logic.

As feature sizes of integrated circuits become smaller, integrated circuit devices may be provided using different logic and resources to support the needs of different types of user designs. Such differences may include, for example, package type, temperature grade (e.g., industrial, military, commercial), etc. However, having a variety of performance attributes or characteristics in integrated circuit devices may lead to difficulties in categorizing multiple devices into a few groups. For example, an FPGA design may have a large number of possible variations to support various target applications such as signal processing, image processing, packet processing, and etc.

Figure 3:
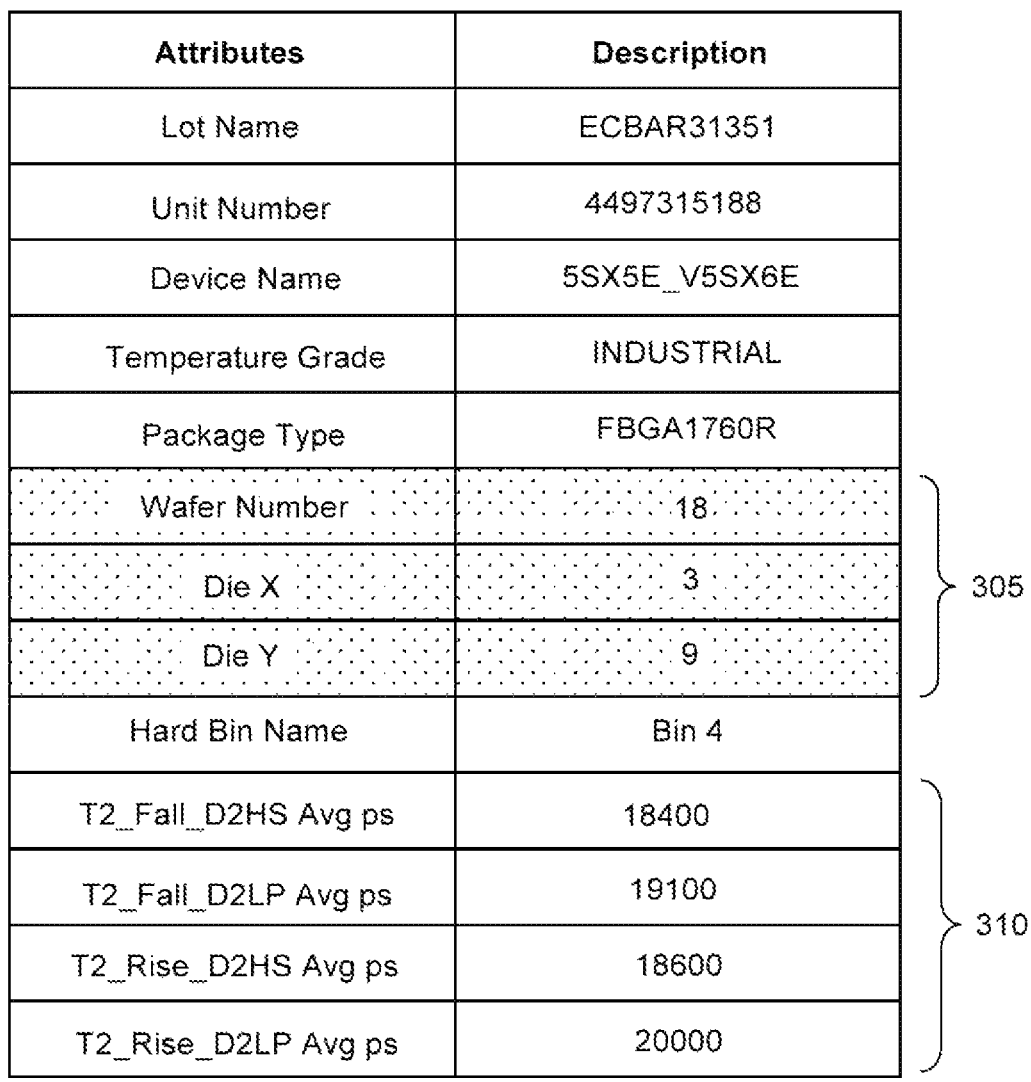
FIG. 3 is a table showing a set of illustrative performance attributes and associated descriptions of an integrated circuit die in accordance with an embodiment of the present invention.

FIG. 3 is a table showing a set of illustrative performance attributes and associated descriptions of an integrated circuit die in accordance with an embodiment of the present invention. Table 300 may be stored in storage of circuitry 60 of FIG. 1. Table 300 may be used to store attributes that characterize an integrated circuit die (e.g., integrated circuit 200 of FIG. 2). As shown in FIG. 3, the integrated circuit die may have standard attributes such as lot name (e.g., "ECBAR31351"), unit number (e.g., 4497315188), device name (e.g., "5SX5E_V5SX6E"), temperature grade (e.g., INDUSTRIAL), package type (e.g., FBGA1760R), etc. In the context of various embodiments, the term "lot name" may generally refer to a name given to a specific quantity or group of a finished device that is produced according to a single manufacturing order during the same cycle of manufacture. The term "unit number" may refer to any combination of letters, numbers, or both, that designates a specific device unit in the group of the finished device. The term "device name" may refer to a name of the particular instance of the device. The term "temperature grade" may refer to the temperature rating of the device. The term "package type" may refer to a specific form of packaging used during the fabrication of the device. These attributes may be added and stored to table 300.

The location coordinates of the integrated circuit die are also stored in table 300, such as wafer number (e.g., wafer 18), the X and Y-coordinates of the integrated circuit die on wafer 18 (e.g., Die X 3, Die Y 9). In one embodiment, the wafer number, and the X-Y coordinates shown in table 300 may collectively be referred to as unique identifier 305. Unique identifier 305 identifies a specific integrated circuit die individually from other integrated circuit dies. In one embodiment, unique identifier 305 may include a character string that may be any desired combination of letters, numbers, punctuation symbols and mathematical symbols. In another embodiment, unique identifier 305 may be represented by characters that are randomly generated by a computer (e.g., computing equipment 56 of FIG. 1).

Table 300 may also store performance attributes 310 of the integrated circuit die. Performance attributes 310 may include core speed, transceiver speed, power, etc. As shown in FIG. 3, each performance characteristic 310 is represented by code names (e.g., T2_Fall_D2HS Avg ps, T2_Fall_D2LP Avg ps, T2_Rise_D2HS Avg ps, T2_Rise_D2LP Avg ps, etc.) on table 300.

Figure 4:
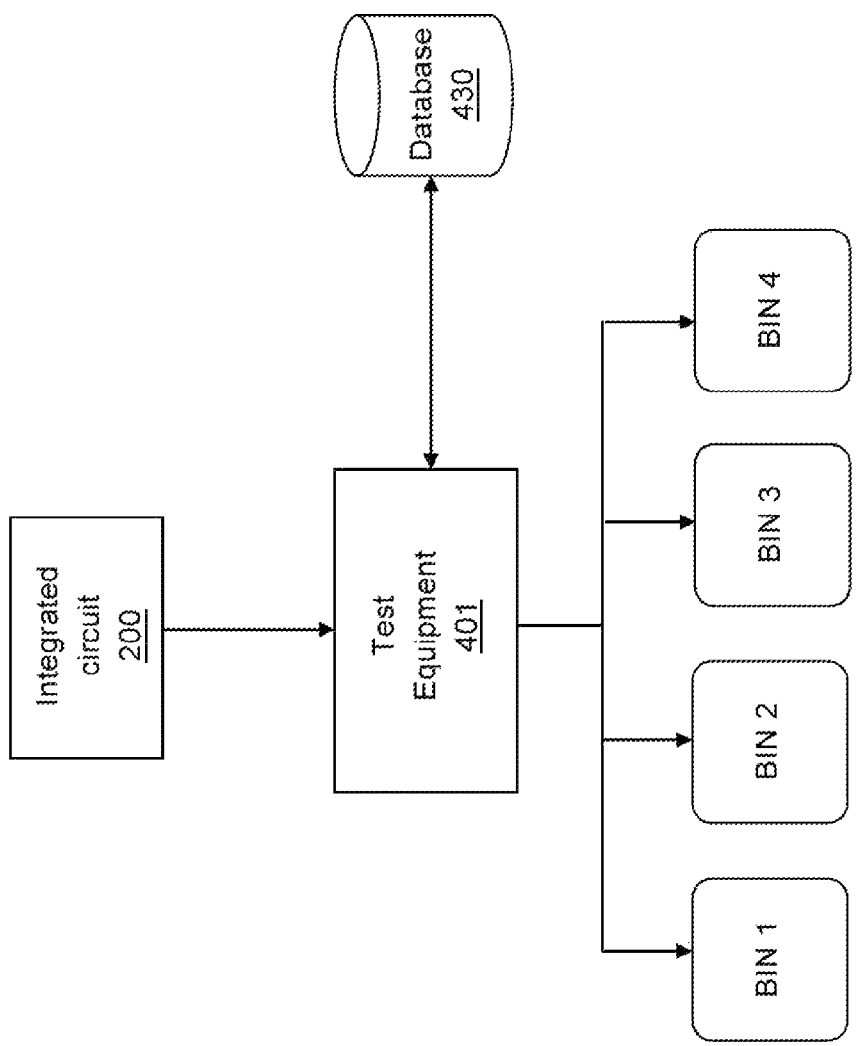
FIG. 4 is a diagram of illustrative test equipment in accordance with an embodiment of the present invention.

FIG. 4 is a diagram of illustrative test equipment 401 in accordance with an embodiment of the present invention. In one embodiment, test equipment 401 is used to test integrated circuit dies (e.g., integrated circuit 200 of FIG. 2) to characterize their performance attributes. It should be appreciated that test equipment 401 can be any type of test equipment that may test the integrated circuit dies that fulfill a desired set of performance attributes.

Following testing, characterization data containing performance attributes for each integrated circuit die is generated and stored in database 430. For example, as shown in table 300 of FIG. 3, the characterization data may include performance attributes and associated descriptions of an integrated circuit die. In one embodiment, database 430 may be part of storage of circuitry 60 of FIG. 1. Each integrated circuit die has a unique identifier (e.g., unique identifier 305) that is exclusive to itself.

The integrated circuit dies may be grouped based on similar performance attributes. For example, integrated circuit dies with high speed performance such as a maximum clock rate greater than a given threshold may be grouped under BIN 1, integrated circuit dies with low frequency jitter such as waiting-time jitter may be grouped under BIN 2, and so on. Information on the binning location of each respective integrated circuit die is also stored in database 430. As will be described in detail below, in one embodiment, test equipment 401 is also used to "virtually" screen or search for specific integrated circuit dies in database 430 without having to perform physical die screening in tester environment.

Figure 5:
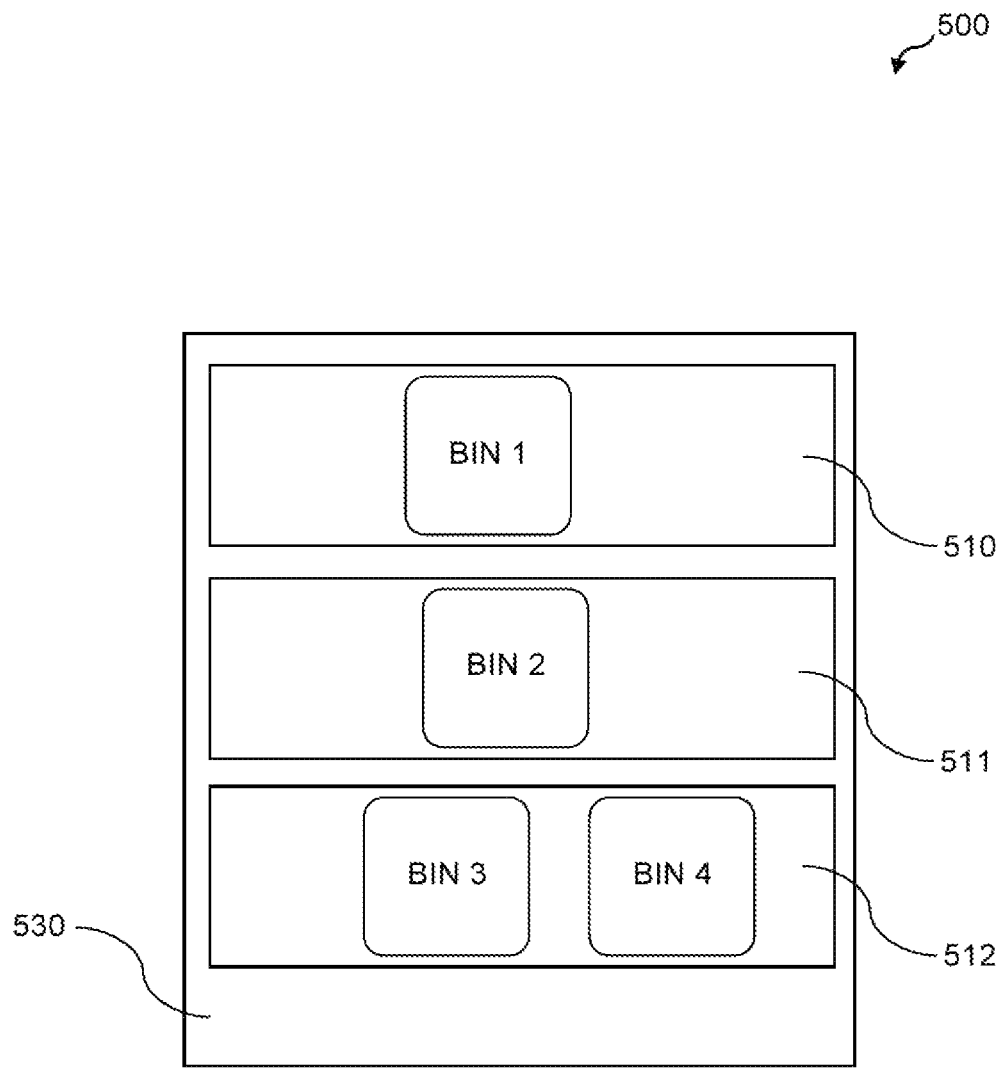
FIG. 5 is a diagram of an illustrative die storage structure in accordance with an embodiment of the present invention.

FIG. 5 is a diagram of an illustrative die storage structure in accordance with an embodiment of the present invention. Before packaging, integrated circuit dies (e.g., integrated circuit 200 of FIGS. 2 and 4) are tested to determine their performance attributes and physically labeled accordingly. Each integrated circuit die is then labeled with a unique identifier. The unique identifier (e.g., unique identifier 305 of FIG. 3) may include a wafer number and X-Y coordinates of the integrated circuit die on a semiconductor wafer (not shown in the figure). The performance attributes and the unique identifier of the integrated circuit dies may then be stored in a table such as table 300 of FIG. 3 in a database (e.g., database 430 of FIG. 4).

After packaging, the integrated circuit dies may go through a binning process whereby integrated circuit dies with similar performance attributes are grouped together and stored to their respective hard bins (also referred to as "physical" bins). In one embodiment, each hard bin is labeled according to the integrated circuit groups (e.g., hard bin "BIN 1", hard bin "BIN 2", hard bin "BIN 3", and hard bin "BIN 4"). For example, as shown in FIG. 4, integrated circuit 200 may be characterized (e.g., using test equipment 401) as a high performance speed die. In this scenario, integrated circuit 200 may be grouped under BIN 1 and stored in hard bin "BIN 1".

The hard bins are then stored in a die storage structure or racked in a warehouse. As shown in FIG. 5, die storage structure 500 is made of rack 530 with rows of levels or shelves (e.g., levels 510, 511 and 512). Each level may store one or more hard bins. For example, level 510 may store hard bin "BIN 1", level 511 may store hard bin "BIN 2", level 512 may store hard bin "BIN 3" and hard bin "BIN 4", and so on. It should be appreciated that die storage structure 500 may have fewer or more racks to store the hard bins.

Figure 6:
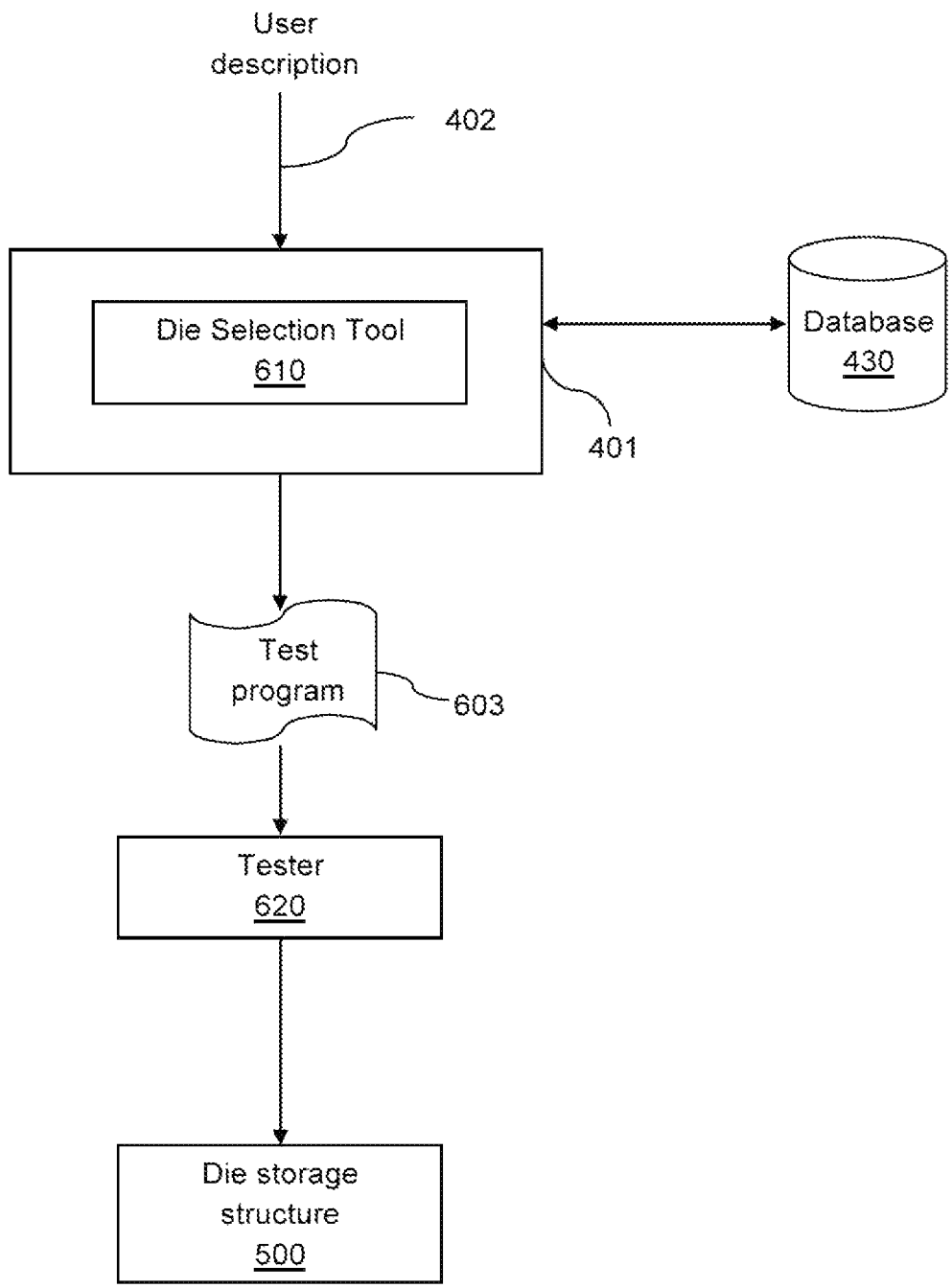
FIG. 6 is a diagram of an illustrative integrated circuit screening system in accordance with an embodiment of the present invention.

FIG. 6 is a diagram of an illustrative integrated circuit screening system in accordance with an embodiment of the present invention. The integrated circuit screening system may include die selection tool 610. Die selection tool 610 may be implemented as part of test equipment 401 of FIG. 4. In one embodiment, die selection tool 610 may be implemented in processing circuitry and storage 60 of FIG. 1. Die selection tool 610 may receive an input (e.g., user description 402) from a user. In the example of FIG. 6, die selection tool 610 may incorporate an input interface to receive user description 402. In one embodiment, user description 402 may include performance criteria description that describes the performance attributes of a desired integrated circuit die.

Die selection tool 610 may allow the user to search for unique identifiers of integrated circuit dies that match user description 402 from storage (e.g., database 430). The use of such a tool eliminates the need to perform physical screening on every hard bin from die storage structure 500 of FIG. 5 to retrieve the desired integrated circuit dies. For example, die selection tool 610 performs a search by matching user description 402 to the attributes stored in table 300 of FIG. 3 in order to retrieve a list of unique identifiers from database 430. For example, a user may provide user description 402 that specifies performance attributes (e.g., transceiver speed, clock frequency, etc.) for a desired integrated circuit die to die selection tool 610. Die selection 610 may then perform a matching operation to match user description 402 to performance attributes 310 of table 300 of FIG. 3, to retrieve the list of unique identifiers. Following that, a test program (e.g., test program 603) is created. In one embodiment, test program 603 contains information of the list of unique identifiers. A tester (e.g., tester 620) is configured to receive test program 603. The tester may communicate with test equipment 401 of FIG. 4 through network 63 of FIG. 1. Tester 620 may perform a die screening to identify the physical locations of one or more integrated circuit dies from die storage structure 500, based on the information received from test program 603 (e.g., the list of unique identifiers).

Figure 7:
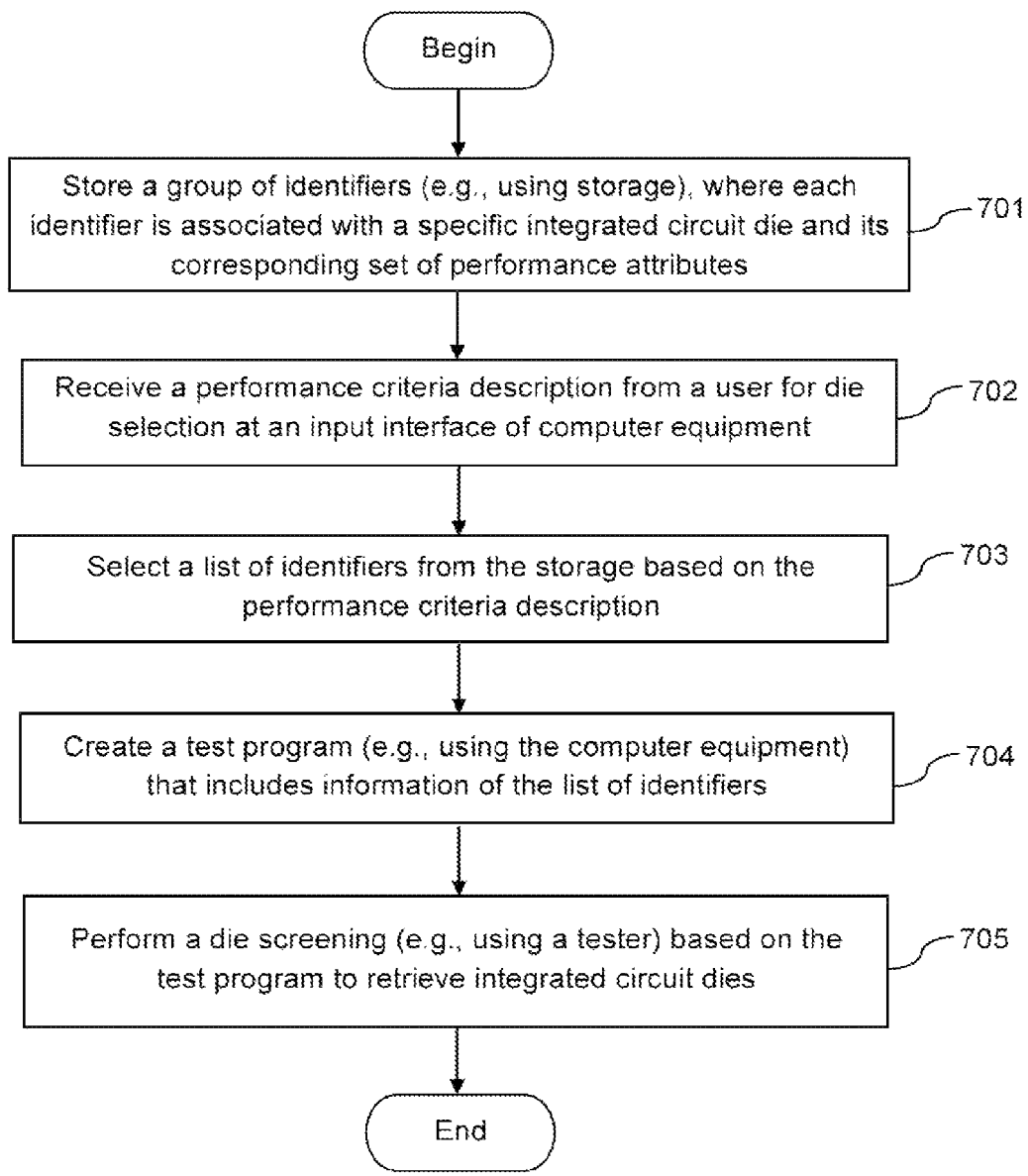
FIG. 7 is a flow chart of illustrative steps for automated die selection based on pre-determined criteria with an embodiment of the present invention.

FIG. 7 is a flow chart of illustrative steps for automated die selection based on pre-determined criteria with an embodiment of the present invention. The operations of FIG. 7 may be performed using test equipment similar to test equipment 401 of FIG. 4. At step 701, a group of identifiers is stored where each identifier is associated with a specific integrated circuit die and a corresponding set of performance attributes. With one suitable approach, a group of integrated circuits dies are tested. In one embodiment, the test equipment is configured to perform die characterization on the group of integrated circuit dies based on performance attributes. Each integrated circuit die is labeled with an identifier and information related to each of the integrated circuits (e.g., performance attributes) is stored in a database (e.g., database 430 of FIG. 4). Following that, the integrated circuit dies may be selectively binned according to different speed and performance gradings. If desired, the integrated circuit dies may be binned based on any desired attributes such as performance, power consumption, etc. As shown in FIG. 4, the integrated circuit dies may be grouped into hard bins such as BIN 1, BIN 2, BIN 3, BIN 4, and so on. In one embodiment, the hard bins are stored in a die storage structure such as die storage structure 500 of FIG. 5.

At step 702, a performance criteria description is received from a user for die selection at an input interface of computer equipment (e.g., computer equipment 56 of FIG. 1). In one embodiment, the performance criteria description includes at lease one performance feature. The performance feature describes a desired performance specification for an integrated circuit die.

At step 703, a list of identifiers is selected from the storage (e.g., database 430 of FIG. 4) based on the performance criteria description. The test equipment may select identifiers having stored performance attributes that match the requested performance criteria description. In one embodiment, each identifier may include information that uniquely identifies the physical location of a specific integrated circuit die on a die storage structure. For example, as shown in FIG. 3, unique identifier 305 may represent a bin location of integrated circuit die in die storage structure 500 of FIG. 5.

At step 704, a test program that includes information of the list of identifiers is created by using computer equipment 56 of FIG. 1. The test program is then loaded into a tester (e.g., tester 620 of FIG. 6) to perform a die screening to retrieve integrated circuit dies at step 705. For example, as shown in FIG. 6, tester 620 is configured to load and execute test program 603. Tester 620 may identify the physical locations of one or more integrated circuit dies to be retrieved from die storage structure 500, based on the information received from test program 603 (e.g., the list of identifiers).

The method and apparatus described herein may be incorporated into any suitable circuit. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method for automated die selection, the method comprising:
with binning tools, characterizing a plurality of integrated circuit dies based on a plurality of performance attributes, wherein the performance attributes include a package type for the plurality of integrated circuit dies;
storing the performance attributes of the plurality of integrated circuit dies in an electronic database;
with computing equipment, receiving at least one requested performance feature;
with the computing equipment, creating a test program to screen the electronic database for a subset of the plurality of integrated circuit dies whose performance attributes satisfy the requested performance feature in response to receiving the at least one requested performance feature;
configuring a tester to run the test program that is based on the requested performance features;
with the tester, producing die screening results by searching the electronic database for a subset of the plurality of integrated circuit dies whose performance attributes satisfy the requested performance feature; and
with the computing equipment, selecting at least one integrated circuit die of the subset of the plurality of integrated circuit dies in response to receiving the die screening results from the tester, and identifying a particular physical bin location associated with the at least one selected integrated circuit die.

2. The method defined in claim 1 wherein characterizing the plurality of integrated circuit dies comprises:
labeling each integrated circuit die with a respective identifier that includes a bin location for a specific integrated circuit die; and
storing the unique identifier of each integrated circuit die in a database.

3. The method defined in claim 2 wherein the bin location uniquely specifies the location coordinates of the specific integrated circuit die on a semiconductor wafer.

4. The method defined in claim 2 further comprising:
matching at least one requested performance feature to the plurality of performance attributes to retrieve the list of unique identifiers.

5. The method defined in claim 4 further comprising:
with the computer equipment, configuring a tester to receive a test program that includes the list of unique identifiers; and
with the tester, performing a screening to identify the physical locations of integrated circuit dies that matches the list of unique identifiers.

6. The method defined in claim 4 wherein the plurality of performance attributes is selected from the group consisting of clock frequency, power consumption, transmission speed, jitter, and latency.

7. A method for using computer equipment having a tester and storage, the method comprising:
storing a plurality of identifiers in an electronic database, wherein each identifier is associated with a respective integrated circuit die, wherein each identifier is stored with a corresponding set of performance attributes;

receiving a performance criteria description from a user for die selection at an input interface of the computer equipment;

selecting a list of identifiers from the storage based on the performance criteria description;

creating a test program using the computing equipment, wherein the test program includes information that identifies integrated circuit dies based on the list of identifiers, wherein the list of identifiers includes a package type of the integrated circuit dies;

producing die screening results at a tester configured with the test program by searching the electronic database for particular integrated circuit dies that satisfy the performance criteria description; and outputting physical locations of a bin that stores at least one integrated circuit die of the particular integrated circuit dies that satisfy the performance criteria description at the tester based on the die screening results produced by searching the electronic database.

8. The method defined in claim 7 wherein selecting the list of identifiers comprises:
matching the performance criteria description to the set of performance attributes of each identifier.

9. The method of claim 8 further comprising:
with the computer equipment, loading the test program on the tester; and
with the tester, executing the test program.

10. The method of claim 9 wherein executing the test program comprises:
performing a search to identify which integrated circuit dies from on the plurality of integrated circuit dies matches the performance criteria description.

11. The method of claim 10 wherein performing the search to identify which integrated circuit dies from the plurality of integrated circuit dies matches the performance criteria description comprises:
selecting only integrated circuit dies of the plurality of integrated circuit dies having identifiers matching the list of identifiers.

12. The method of claim 7 further comprising:
configuring the tester to perform die characterization based on performance attributes, wherein the performance features of each integrated circuit die is then stored in the storage.

13. A method of selecting an integrated circuit die using test equipment, the method comprising:

receiving a requested die performance criteria at an input interface of the test equipment, wherein the performance criteria include a package type of a requested die;

searching a database that stores performance criteria of a set of characterized integrated circuit dies to determine a target integrated circuit that satisfies the requested die performance criteria and retrieving physical location coordinates of the target integrated circuit from the database; and with a tester, outputting the physical location coordinates of a physical bin that stores the target integrated circuit that fulfills the die performance criteria.

14. The method defined in claim 13 wherein the location coordinates of the integrated circuit die specifies a rack and level of a die storage structure at which to store the integrated circuit die.

15. The method defined in claim 13 wherein retrieving the location coordinates of the integrated circuit die comprises:
matching the die performance criteria to a set of rules to retrieve the location coordinates, wherein the set of rules includes performance features of the integrated circuit die.

16. The method defined in claim 15 wherein the integrated circuit die comprises a given integrated circuit die of a plurality of integrated circuit dies, the method further comprising:
characterizing the plurality of integrated circuit dies based on performance features; and
assigning a respective identifier to each of the plurality of integrated circuit dies.

17. The method defined in claim 16 wherein characterizing the plurality of integrated circuit dies comprises:
generating characterization data for the integrated circuit dies, wherein the characterization data comprises performance attributes related to the plurality of integrated circuit dies.

18. The method defined in claim 13 further comprising:
with the test equipment, creating a test program that includes the retrieved location coordinates.

19. The method defined in claim 18 wherein creating the test program that includes the retrieved location coordinates further comprising:
with the test equipment, configuring a tester to run the test program.

20. The method defined in claim 19 further comprising:
with the tester, executing the test program to determine the physical location of a specific integrated circuit die based on the retrieved location coordinates.

* * * * *